United States Patent
Lee et al.

(10) Patent No.: US 9,159,844 B2
(45) Date of Patent: Oct. 13, 2015

(54) NONVOLATILE MEMORY DEVICE AND FABRICATING METHOD THEREOF

(71) Applicant: UNITED MICROELECTRONICS CORPORATION, Hsinchu (TW)

(72) Inventors: Chih-Haw Lee, New Taipei (TW); Tzu-Ping Chen, Hsinchu County (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 136 days.

(21) Appl. No.: 13/867,125

(22) Filed: Apr. 22, 2013

(65) Prior Publication Data

US 2014/0312407 A1 Oct. 23, 2014

(51) Int. Cl.
| | |
|---|---|
| H01L 29/792 | (2006.01) |
| H01L 29/66 | (2006.01) |
| H01L 21/28 | (2006.01) |
| H01L 29/423 | (2006.01) |
| H01L 27/115 | (2006.01) |

(52) U.S. Cl.
CPC ........ *H01L 29/792* (2013.01); *H01L 21/28282* (2013.01); *H01L 27/11568* (2013.01); *H01L 29/4234* (2013.01); *H01L 29/66833* (2013.01)

(58) Field of Classification Search
CPC ............ H01L 29/66833; H01L 29/792; H01L 21/28273; H01L 21/28282; H01L 29/42332; H01L 29/42348; H01L 29/66825; H01L 29/7887; H01L 29/7923; H01L 27/11568; H01L 29/4234
USPC ........................................................ 257/324
See application file for complete search history.

(56) References Cited

U.S. PATENT DOCUMENTS

| | | | | |
|---|---|---|---|---|
| 2004/0222452 | A1* | 11/2004 | Matsuoka et al. | 257/296 |
| 2004/0245564 | A1* | 12/2004 | Ogura et al. | 257/315 |
| 2007/0161174 | A1* | 7/2007 | Lee et al. | 438/216 |
| 2010/0301404 | A1* | 12/2010 | Kawashima | 257/316 |

OTHER PUBLICATIONS

U.S. Appl. No. 13/633,732, filed Oct. 2, 2012.

\* cited by examiner

*Primary Examiner* — Ermias Woldegeorgis
(74) *Attorney, Agent, or Firm* — Ding Yu Tan

(57) ABSTRACT

A nonvolatile memory device comprises a substrate, a gate electrode, a single charge trapping sidewall and a source/drain region. The gate electrode is disposed on and electrically isolated from the substrate. The single charge trapping sidewall is disposed adjacent to a sidewall of the gate electrode and electrically isolated from the substrate and the gate electrode, so as to form a non-straight angle between the substrate and the single charge trapping sidewall. The source/drain region is disposed in the substrate and adjacent to the gate electrode.

7 Claims, 4 Drawing Sheets

NONVOLATILE MEMORY DEVICE AND FABRICATING METHOD THEREOF

FIELD OF THE INVENTION

The present invention relates to a semiconductor device and the method for fabricating the same, and more particularly to a non-volatile memory device with a metal gate and the fabricating method thereof.

BACKGROUND OF THE INVENTION

Non-volatile memory cells are widely used because they can store data even when the power supply is cut off Generally, non-volatile memory cells can be sub-classified into two types, floating-gate structure and SONOS structure. The floating-gate structure utilizes source side injection (SSI) or tunneling effect leading hot electrons stored in the floating gate.

However, the application of the floating-gate structure is increasingly difficult day after day, because of the hot electrons punching through along the select gate channel as the source-drain channel length shrinks. In comparison with the floating-gate structure, the SONOS structure which also leads hot electrons stored in a silicon nitride layer, can be manufactured in a smaller critical size by simpler processes, by which functions of multi-level storage are provided to overcome the drain-induced turn-on effect. Therefore, there is a prevailing tendency today to replace the floating-gate structure with the SONOS structure.

However, for the purpose of improving the performance of the non-volatile memory cells, there are still a number of challenges presented to the industry in terms of improving the programming and erasing (P/E) speed, decreasing the operation voltage and improving the reliability of the SONOS structure.

Therefore, there is a need of providing an improved memory device and the fabricating method thereof to obviate the drawbacks encountered from the prior art.

SUMMARY OF THE INVENTION

In accordance with one aspect, the present invention provides a nonvolatile memory device, wherein the nonvolatile memory device comprises a substrate, a gate electrode, a single charge trapping sidewall and a source/drain region. The gate electrode is disposed on and electrically isolated from the substrate. The single charge trapping sidewall is disposed adjacent to a sidewall of the gate electrode and electrically isolated from the substrate and the gate electrode, so as to form a non-straight angle between the substrate and the single charge trapping sidewall. The source/drain region is disposed in the substrate and adjacent to gate electrode.

In one embodiment of the present invention, the single charge trapping sidewall is disposed between the substrate and the gate electrode.

In one embodiment of the present invention, the single charge trapping sidewall has an I-shaped or L-shaped cross-section.

In one embodiment of the present invention, the non-straight angle formed between the substrate and the single charge trapping sidewall is greater than 0° and substantially less than or equal to 90°.

In one embodiment of the present invention, the nonvolatile memory device further comprises a first dielectric layer used to electrically isolate the substrate from the gate electrode, and a second dielectric layer used to electrically isolate the gate electrode from the single charge trapping sidewall.

In one embodiment of the present invention, the single charge trapping sidewall includes silicon nitride; and both of the first dielectric layer and the second dielectric layer are made of silicon oxide.

In one embodiment of the present invention, the nonvolatile memory device further comprises a spacer disposed on a side of the single charge trapping sidewall departing from the gate electrode.

In accordance with another aspect, the present invention provides a nonvolatile memory device matrix comprising a plurality of nonvolatile memory devices as mentioned above to be arranged in plural columns and rows.

In one embodiment of the present invention, the source/drain regions of two adjacent nonvolatile memory devices of the nonvolatile memory device matrix are partially overlapped to form a common source/drain region.

In one embodiment of the present invention, the two single charge trapping sidewalls of the two adjacent nonvolatile memory devices are disposed at opposite sides of the corresponding gate electrodes of the two adjacent nonvolatile memory devices.

In accordance with yet another aspect, the present invention provides a method for fabricating a nonvolatile memory device, wherein the method comprises steps as follows:

Firstly, a first dielectric layer and a gate electrode layer are sequentially formed on a substrate. A gate structure is then formed by steps of patterning the gate electrode layer and the first dielectric layer layer. Next, a second dielectric layer and a charge trapping layer are formed in sequence to cover at least one sidewall of the gate structure. Thereinafter, portions of the charge trapping layer and the gate structure are removed to form a single charge trapping sidewall adjacent to the sidewall of the remaining gate structure. Subsequently, a source/drain region is formed in the substrate adjacent to the remaining gate structure.

In one embodiment of the present invention, the process for patterning the gate electrode layer and the first dielectric layer comprises steps of etching the gate electrode layer to form a gate electrode; and performing an isotropic etching process to remove a portion of the first dielectric layer using the gate electrode as a mask, so as to form a plurality of undercuts at a bottom of the gate structure.

In one embodiment of the present invention, the undercuts are filled by the subsequently formed charge trapping layer, instead of the second dielectric layer.

In one embodiment of the present invention, the process for removing a portion of the charge trapping layer comprises a step of patterning the charge trapping layer to form a first single charge trapping sidewall adjacent to a first sidewall of the gate structure, and a second single charge trapping sidewall adjacent to a second sidewall of the gate structure.

In one embodiment of the present invention, the process for removing a portion of the gate structure comprises a step of dividing the gate structure into a first gate structure portion and a second gate structure portion, wherein the first gate structure portion includes the first sidewall and the first single charge trapping sidewall, and the second gate structure portion includes the second sidewall and the second single charge trapping sidewall.

In one embodiment of the present invention, the method for fabricating a nonvolatile memory device further comprises steps of forming a first spacer adjacent to the first gate structure portion and the first single charge trapping sidewall; and forming a second spacer adjacent to the second gate structure portion and the second single charge trapping sidewall.

In one embodiment of the present invention, the process for forming the source/drain region comprises steps of performing at least one ion implantation to form a common source/drain region between the first gate structure portion and the second gate structure portion.

In accordance with the aforementioned embodiments of the present invention, a nonvolatile memory device and the fabrication thereof are provided, wherein the nonvolatile memory device comprises an asymmetric SONOS structure having a single charge trapping sidewall disposed adjacent to one sidewall of a gate electrode, wherein the gate electrode is disposed on a substrate and electrically isolated from the substrate by a dielectric layer; the single charge trapping sidewall is electrically isolated from the substrate and the gate electrode by another dielectric layer; and a non-straight angle is form between the substrate and the single charge trapping sidewall.

Since the nonvolatile memory device has only one single charge trapping sidewall disposed at one side of the SONOS structure, thus when the nonvolatile memory device is programmed, charge trapping could not occur at the other side of the nonvolatile memory device departing from the single charge trapping sidewall, and a normal read process could be performed without increasing the operation voltage of the nonvolatile memory device Such that, the power consumption of the reading process and the breakdown voltage of the nonvolatile memory device can be significantly reduced; electromagnetic interference imposed to the peripheral devices due to the reading or programming process of the nonvolatile memory device can be avoided; the source/drain doping concentration of the nonvolatile memory device can be reduced; and the short channel effect and hot-carrier effect that may trigger a punch through of the nonvolatile memory device can be also depressed. Accordingly, it is beneficial for shrinking the critical dimension of the nonvolatile memory device.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 1H illustrates a cross-sectional view of a nonvolatile memory device in accordance with an another embodiment of the present invention.

DETAILED DESCRIPTION OF PREFERRED EMBODIMENTS

A nonvolatile memory device and a method for fabricating the same are provided by the present invention. The present invention will now be described more specifically with reference to the following embodiments. It is to be noted that the following descriptions of preferred embodiments of the present invention are presented herein for purpose of illustration and description only. It is not intended to be exhaustive or to be limited to the precise form disclosed.

Figure 1A:
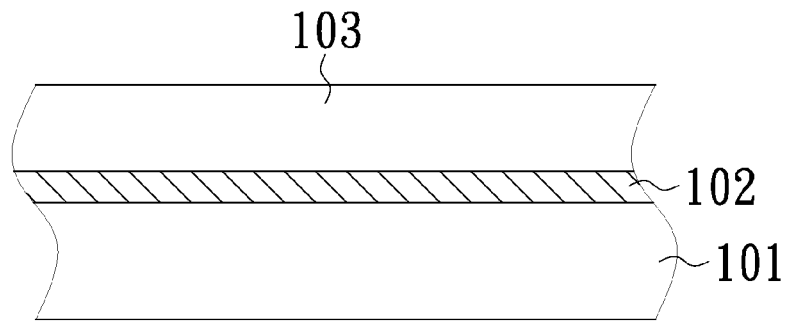
FIGS. 1A-1H are cross-sectional views illustrating the processing structures for fabricating a nonvolatile memory device in accordance with one embodiment of the present invention.

FIGS. 1A-1H are cross-sectional views illustrating the processing structures for fabricating a nonvolatile memory device 100 in accordance with one embodiment of the present invention, wherein the method for fabricating the nonvolatile memory device 100 comprises steps as follows:

Firstly, a first dielectric layer 102 and a gate electrode layer 103 are formed in sequence above a substrate 101 (See FIG. 1A). In the present embodiment, the substrate 101 is a silicon substrate having a P well region; the first dielectric layer 102 is formed on the P well region of the silicon substrate 101; and the gate electrode layer 103 is made of poly silicon.

Figure 1B:
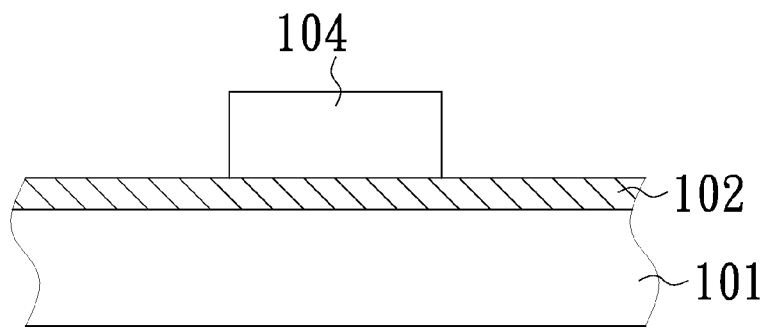
Figure 1C:
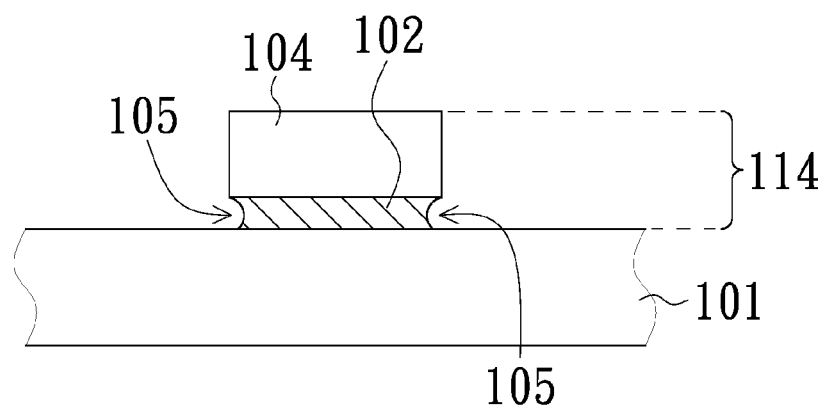

The gate electrode layer 103 is then patterned to form a gate electrode 104 using the first dielectric layer 102 acting as an etching stop layer (See FIG. 1B). An isotropic etching process, such as a wet etching process, is then performed to remove a portion of the first dielectric layer 102 that is not covered by the gate electrode 104, so as to form a gate structure 114 having the remained first dielectric layer 102 in combination with the gate electrode 104 (See FIG. 1C).

In some embodiments of the present invention, an etchant comprising hydrogen fluoride (HF) is applied to remove a portion of the first dielectric layer 102. In the present embodiment, the isotropic etching not only takes place vertically to remove the portion of the dielectric layer 102 that is not covered by the gate electrode 104, but also takes place laterally to remove a portion of the first dielectric layer 102 disposed under the gate electrode 104. Such that a plurality of undercuts 105 are formed at the bottom of the gate structure 114.

Figure 1D:
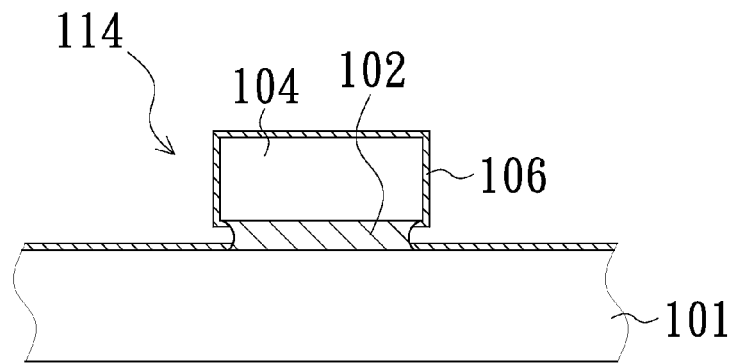
Figure 1E:
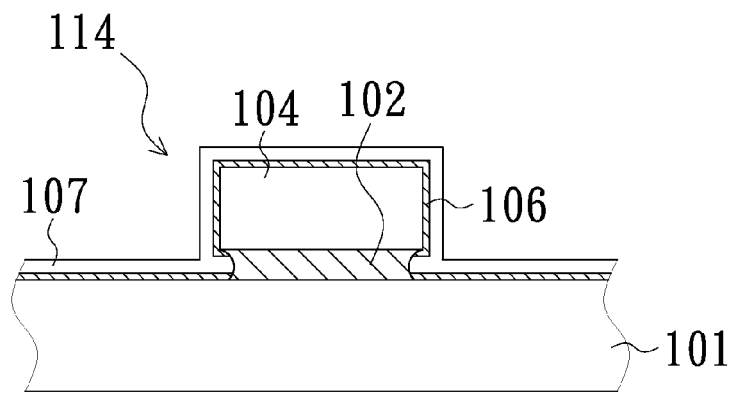

Next, a second dielectric layer 106 is formed on the portions of the silicon substrate 101 and the gate electrode 104 which are exposed by the aforementioned etching and patterning process (See FIG. 1D). In some embodiments of the present invention, the second dielectric layer 106 is a silicon oxide film formed by thermal oxidation or silicon oxide deposition. In some embodiments of the present invention, the undercuts 105 formed at the bottom of the gate structure 114 may be filled by the second dielectric layer 106. However in some other embodiments, the undercuts 105 are filled by a silicon nitride layer 107 subsequently formed on the second dielectric layer 106 (See FIG. 1E), instead of the second dielectric layer 106. But it should be noted that, the silicon nitride layer 107 may be substituted by other material layers made by any suitable material capable of trapping charge.

Subsequently, an anisotropic etching process is performed using the substrate 101 and the gate electrode 104 serving as an etching stop layer to remove portions of the silicon nitride layer 107 and the second dielectric layer 106 and to leave behind another remained portions of the silicon nitride layer 107 and the second dielectric layer 106 that are disposed on a plurality of sidewalls 114a and 114b of the gate structure 114. In the present embodiment, the portions of the silicon nitride layer 107 and the second dielectric layer 106 that are used to fill the undercuts 105 are also remained or kept (See FIG. 1F).

Figure 1F:
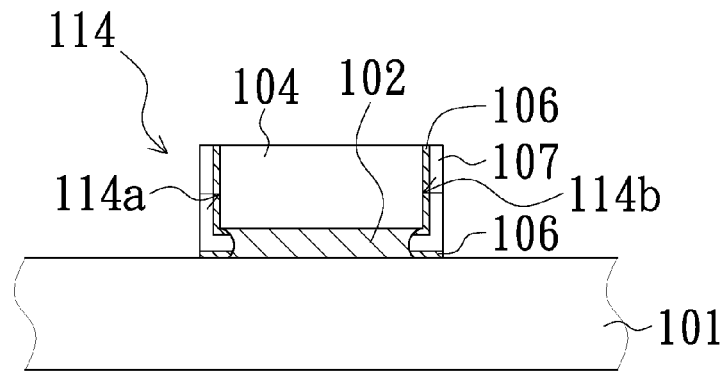
Figure 1G:
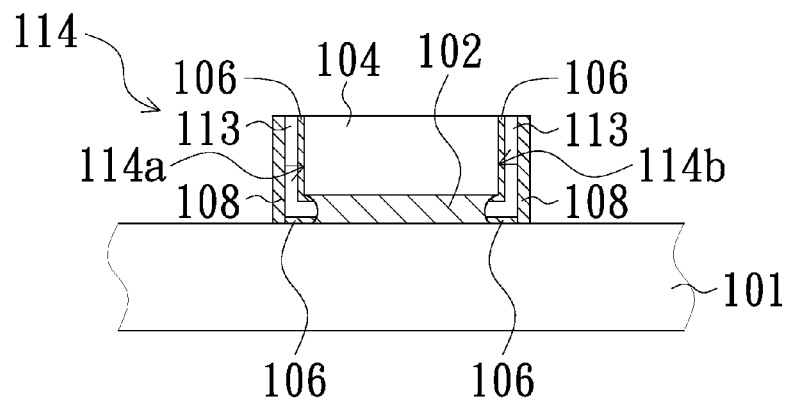

A third dielectric layers 108 are then formed on at least one side of the silicon nitride layer 107 departing or away from the gate structure 114, so as to electrically isolate the silicon nitride layer 107 from the substrate 101 (See FIG. 1G). In the present embodiment, the third dielectric layer 108 preferably is a patterned silicon dioxide layer formed by at least one thermal deposition process and at least one patterning process.

Figure 1H:
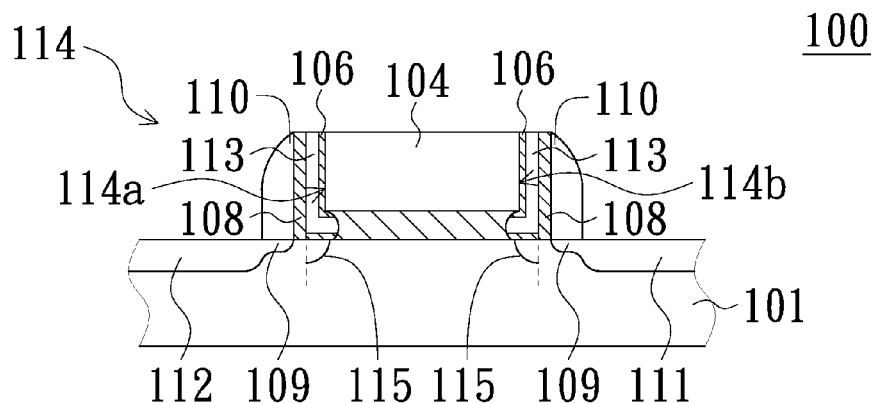
Figure 1H:
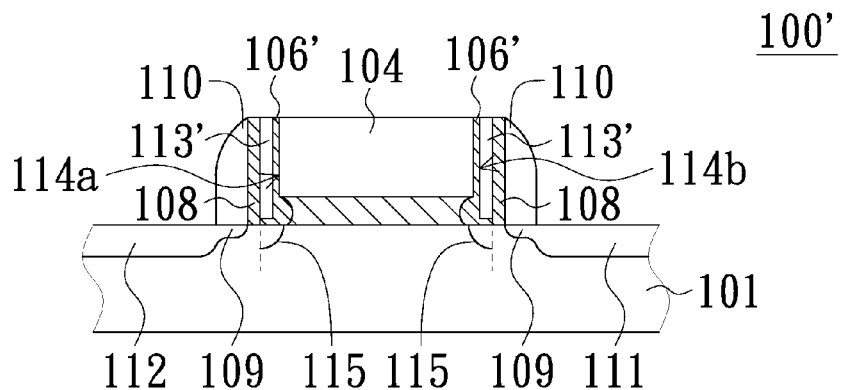

Next, at least one ion implantation process is performed using the third dielectric layer 108, the remaining silicon nitride layer 107, the remaining second dielectric layer 106 and the gate structure 114 as a mask to form a light drain doping (LDD) region 109 in the substrate 101. A spacer 110 is then formed on at least one side of the third dielectric layers 108 departing from the gate structure 114. Subsequently, yet at least one ion implantation process is performed using the gate structure 114 and the spacers 110 as a mask to form a source region 112 and a drain region 111 in the substrate 101, meanwhile the nonvolatile memory device 100 as shown in FIG. 1H is completed.

In the present embodiment, the nonvolatile memory device 100 (see FIG. 1H) has two multilayer structures in which each structure including the remaining second dielectric layer 106, the remaining silicon nitride layer 107 and the third dielectric layer 108 symmetrically disposed on two opposite sidewalls 114a and 114b of the gate structure 114; and two symmetrical SONOS structures can be formed on the two opposite sidewalls 114a and 114b of the gate structure 114 by associating the two multilayer structures with the substrate 101 and the gate electrode 104.

Since the remaining silicon nitride layer 107 configured as two sidewalls standing on the substrate 101 is capable of trapping charge, thus it may serve as the charge trapping layers (hereinafter referred as a plurality of charge trapping sidewalls 113) of the SONOS structures; the combination of the third dielectric layers 108 and a portion of the remaining first dielectric layer 102 that is capable of electrically isolating the charge trapping sidewalls 113 from the substrate 101 may serve as the tunnel oxide layers of the SONOS structures; the combination of the remaining second dielectric layer 106 and another portion of the remaining first dielectric layer 102 that is capable of electrically isolating the charge trapping sidewalls 113 from the gate electrode 104 may serve as the block oxide layers of the SONOS structures.

In some embodiments of the present invention, these two charge trapping sidewalls 113 and the substrate 101 can make two non-straight angles 115. In the present embodiment, the non-straight angles 115 formed by the substrate 101 and the single charge trapping sidewalls 113 are substantially equal to 90°. However, in some other embodiments, each of the non-straight angles 115 may be greater than 0° and less than 90°.

In the present embodiment, each of these two charge trapping sidewalls 113 not only has a vertical sidewall but also has a lateral extension disposed under the gate structure 114 and being used to fill the undercuts 105, such that each of the charge trapping sidewalls 113 has a L-shaped cross-section. However, in some other embodiments (see FIG. 1H'), each of the charge trapping sidewalls 113' has an I-shaped cross-section, since the undercuts 105 are filled by the second dielectric layer 106' before the silicon nitride layer 107 portions serving as the charge trapping sidewalls 113' are formed.

In some embodiments of the present invention, a plurality of the nonvolatile memory devices 100 can be arranged in plural columns and rows, so as to form a nonvolatile memory device matrix.

In the present embodiment, when the nonvolatile memory devices 100 is programmed by Channel Hot Electron Injection (CHE) mechanism, positive bias is applied on the gate electrode 104 and the drain region 111 to form a lateral electric field accelerating electrons close to the drain region 111 passing through the tunnel oxide layer of the SONOS structures and injecting into the charge trapping sidewalls 113. Preferably, positive bias of 7V and 5.5V are respectively applied on the gate electrode 104 and the drain region 111.

Alternatively, when the nonvolatile memory devices 100 is programmed by Channel Initiated Secondary Electron Injection (CHISEL) mechanism, positive bias is applied on the gate electrode 104 and the source region 112; and negative bias is applied on the substrate 101 to drive hot electrons resulted from secondary impact injecting into the charge trapping sidewalls 113. Preferably, positive bias of 7V and 3V are respectively applied on the gate electrode 104 and the source region 112; and negative bias of −2V is applied on the drain region 111.

Since the charge trapping sidewalls 113 that are capable of trapping charge may result in read disturb, thus reverse read process is applied to improve the reading sensitivity of the nonvolatile memory devices 100. In the present embodiment, the voltage applied on the gate electrode 104 and the drain region 111 to perform the reverse read process are kept at 2.8V and 0.9V.

Figure 2A:
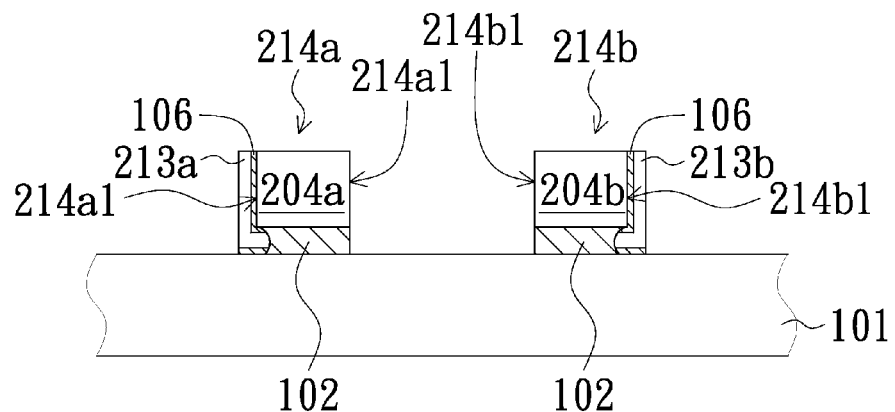
FIGS. 2A-2B are cross-sectional views illustrating the processing structures for fabricating a nonvolatile memory device in accordance with a yet another embodiment of the present invention.
Figure 2B:
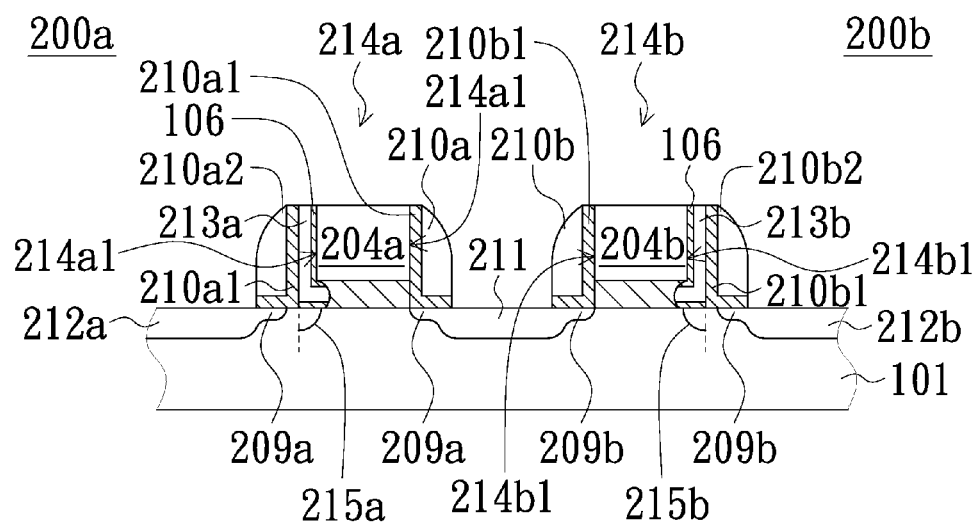

FIGS. 2A-2B are cross-sectional views illustrating the processing structures for fabricating a nonvolatile memory device, such as the nonvolatile memory device 200a or 200b, in accordance with one embodiment of the present invention. Because the method for fabricating the nonvolatile memory device 200a or 200b are quite similar to that for fabricating the nonvolatile memory device 100, and a difference may merely exist after some identical steps are carried out, thus these identical steps will not be redundantly described, and for clarification and brevity, identical elements are designated by identical numeral references.

In the present embodiment, the method for fabricating the nonvolatile memory devices 200a and 200b may be continued from the step depicted in FIG. 1F. After the anisotropic etching process is carried out, an etching process is performed to divide the gate structure 114 into a first gate structure portion 214a and a second gate structure portion 214b (see FIG. 2A).

Wherein the first gate structure portion 214a includes a gate electrode 204a (a portion of the remaining gate electrode 104), a portion of the remaining first dielectric layer 102 and a portion of the multilayer structure including a portion of the remaining second dielectric layer 106 and a portion of a charge trapping sidewall 213a that are disposed on the sidewall 114a of the gate structure 114 depicted in FIG. 1G; the second gate structure portion 214b includes a gate electrode 204b (another portion of the remaining gate electrode 104), a portion of the remaining first dielectric layer 102 and a portion of the multilayer structure including the other portion of the remaining second dielectric layer 106 and the other portion of a charge trapping sidewall 213b that are disposed on the sidewall 114b of the gate structure 114.

Next, at least one ion implantation process is performed using the first gate structure portion 214a and the second gate structure portion 214b as masks to form a plurality of LDD regions 209a and 209b in the substrate 101. A plurality of spacers 210a and 210b are then formed respectively on the exposed sidewall of the first gate structure portion 214a and the second gate structure portion 214b as well as the charge trapping sidewalls 213a and 213b, respectively departing from the first gate structure portion 214a and the second gate structure portion 214b.

In the present embodiment, each of the spacers 210a and 210b comprises a two-layer structure, wherein the spacer 210a is constituted by an L-shaped silicon dioxide layer 210a1 and a dielectric layer 210a2 overlying on the L-shaped silicon dioxide layer 210a1; and the spacer 210b is constituted by an L-shaped silicon dioxide layer 210b1 and a dielectric layer 210b2 overlying on the L-shaped silicon dioxide layer 210b1. The dielectric layer 210a2 and 210b2 may be made of silicon dioxide, silicon nitride, silicon oxynitride or other suitable dielectric material.

Subsequently, yet at least one ion implantation process using the first gate structure portion 214a, the second gate structure portion 214b and the spacer 210a and 210b as masks, is performed to form a source regions 212a, a drain region 212b and a common source/drain region 211 in the substrate 101 adjacent to the first gate structure portion 214a and the second gate structure portion 214b, meanwhile the nonvolatile memory devices 200a and 200b as shown in FIG. 2B are completed.

In the present embodiment, each of the two adjacent nonvolatile memory devices 200a and 200b has the gate electrode 204a (or 204b) and the multilayer structure including a portion of the second electric layer 106, one of the charge trapping sidewalls 113 and an L-shaped silicon dioxide layer 210a1 (210b1), wherein the gate electrode 204a and the multilayer structure can be associated with the substrate 101 to form a SONOS structure.

In the embodiments of the present invention, the nonvolatile memory devices 200a and 200b have appeared to be identical but in fact reversed mirror-image structures; and each of these two adjacent nonvolatile memory devices 200a and 200b has one single charge trapping sidewall 213a or 213b disposed at opposite sides of the corresponding gate electrodes 204a and 204b. Referring to FIG. 2B, the single charge trapping sidewall 213a of the nonvolatile memory devices 200a is disposed adjacent to a left sidewall 214a1 of the first gate structure portion 214a; and the single charge trapping sidewall 213b of the nonvolatile memory devices 200b is disposed adjacent to a right sidewall 214b1 of the second gate structure portion 214b.

In addition, the single charge trapping sidewalls 213a and 213b may form two non-straight angles 215a and 215b with the substrate 101 respectively, and both of the two non-straight angles 215a and 215b preferably are both equal to 90°. However, in some other embodiments, each of the two non-straight angles 215a and 215b may be greater than 0° and less than 90.

In some embodiments of the present invention, the source/drain regions of these two adjacent nonvolatile memory devices 200a and 200b may partially overlap to form a common source/drain region 211 in the substrate 101 between the first gate structure portion 214a and the second gate structure portion 214b.

In some embodiments of the present invention, a plurality of the nonvolatile memory devices 200a and 200b can be arranged in plural columns and rows, so as to form a nonvolatile memory device matrix.

In the present embodiment, when the nonvolatile memory device 200b (that is taken as an example) is programmed by CHE mechanism, positive bias of 7V and 5.5V are respectively applied on the gate electrode 204b and the drain region 212b. Alternatively, when the nonvolatile memory devices 200b is programmed by CHISEL mechanism, positive bias of 7V and 3V are applied on the gate electrode 104 and the source region(the common source/drain region 211); and negative bias of −2V is applied on the drain region 212b. When the nonvolatile memory devices 200b is read by a reverse read process, the voltage applied on the gate electrode 104 and the drain region 111 are kept at 2.8V and 0.9V.

In comparison of the operation voltages of the nonvolatile memory devices 100 and 200b, it can be indicated that, the operation voltage for programming the nonvolatile memory devices 100 either by CHE mechanism or by CHISEL mechanism is similar to that for programming the nonvolatile memory devices 200b. However, the voltage applied on nonvolatile memory devices 200b to perform the reverse read process is much lower than that applied on nonvolatile memory devices 100.

On the one hand, because the nonvolatile memory devices 100 has two charge trapping sidewalls 113 that are capable of trapping charge and symmetrically disposed adjacent to the source region 112 and the drain region 111. Thus when a reverse read process is performed by the nonvolatile memory devices 100, the programming voltage must be increased to lead a wider symmetric depletion region overlapping the channel of the nonvolatile memory devices 100 in order to allowing more current passing through. However, this approach may lead current leakage occurring at the region adjacent to the source region 112 and the power consumption of the nonvolatile memory devices 100 is thereby increased, and the peripheral devices may be adversely affected by the reverse read process. In addition, to improve the reverse read process, the nonvolatile memory device 100 would face a dilemma between increasing the doping concentration of the source region 112 and the drain region 111 to improve the reading current and increasing the channel length to prevent the nonvolatile memory device 100 punch through due to short channel effect or hot-carrier effect.

On the other hand, since the nonvolatile memory devices 200b, for example, merely has a single charge trapping sidewall disposed adjacent to the drain region 212b, thus trapping charge may not occur at the region adjacent to the source region (the common source/drain region 211) during the program process, and when the reverse read process is performed, the breakdown voltage and the operation voltage applied on the nonvolatile memory devices 200b can be reduced. As a result, current leakage occurring at the region adjacent to the common source/drain region 211 of the nonvolatile memory devices 200 could be decreased; the breakdown voltage of the nonvolatile memory device 200 and the operation voltage as well as the power consumption during the reading process can be significantly reduced; electromagnetic interference imposed to the peripheral devices due to the reading or programming process of the nonvolatile memory device 200 can be avoided; the concentration of the source/drain region of the nonvolatile memory device 200 can be decreased; and the short channel effect and hot-carrier effect that may trigger a punch through of the nonvolatile memory device 200 can be also improved by being depressed. Accordingly, it is beneficial for shrinking the critical dimension of the nonvolatile memory device.

In accordance with the aforementioned embodiments of the present invention, a nonvolatile memory device and the fabrication thereof are provided, wherein the nonvolatile memory device comprises an asymmetric SONOS structure having a single charge trapping sidewall disposed adjacent to one sidewall of a gate electrode, wherein the gate electrode is disposed on and electrically isolated from a substrate by a dielectric layer; the single charge trapping sidewall is electrically isolated from the substrate and the gate electrode by another dielectric layer; and a non-straight angle is formed between the substrate and the single charge trapping sidewall.

Since the nonvolatile memory device has only one single charge trapping sidewall disposed at one side of the SONOS structure, thus when the nonvolatile memory device is programmed, charge trapping could not occur at the other side of the nonvolatile memory device departing from the single charge trapping sidewall, and a normal read process could be performed without increasing the operation voltage of the nonvolatile memory device Such that, the power consumption of the reading process and the breakdown voltage of the nonvolatile memory device can be significantly reduced; electromagnetic interference imposed to the peripheral devices due to the reading or programming process of the nonvolatile memory device can be avoided; the source/drain doping concentration of the nonvolatile memory device can be reduced; and the short channel effect and hot-carrier effect that may trigger a punch through of the nonvolatile memory device can be also depressed. Accordingly, it is beneficial for shrinking the critical dimension of the nonvolatile memory device.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for fabricating a nonvolatile memory device, comprising steps as follows:

forming a first dielectric layer and a gate electrode layer in sequence on a substrate;

patterning the gate electrode layer and the first dielectric layer to form a gate structure;

forming a second dielectric layer and a charge trapping layer in sequence to cover at least one sidewall of the gate structure;

removing portions of the charge trapping layer and the gate structure to form a single charge trapping sidewall adjacent to the sidewall of the remaining gate structure; and forming a source/drain region in the substrate adjacent to the remaining gate structure.

2. The method for fabricating a nonvolatile memory device according to claim 1, wherein the process for patterning the gate electrode layer and the first dielectric layer comprises steps of:

etching the gate electrode layer to form a gate electrode; and performing an isotropic etching process to remove a portion of the first dielectric layer using the gate electrode as a mask, so as to form a plurality of undercuts at a bottom of the gate structure.

3. The method for fabricating a nonvolatile memory device according to claim 1, wherein the undercuts are filled by the subsequently formed charge trapping layer, instead of the second dielectric layer.

4. The method for fabricating a nonvolatile memory device according to claim 1, wherein the process for removing a portion of the charge trapping layer comprises a step of patterning the charge trapping layer to form a first single charge trapping sidewall adjacent to a first sidewall of the gate structure, and a second single charge trapping sidewall adjacent to a second sidewall of the gate structure.

5. The method for fabricating a nonvolatile memory device according to claim 4, wherein the process for removing a portion of the gate structure comprises dividing the gate structure into a first gate structure portion and a second gate structure portion, wherein the first gate structure portion includes the first sidewall and the first single charge trapping sidewall, and the second gate structure portion includes the second sidewall and the second single charge trapping sidewall.

6. The method for fabricating a nonvolatile memory device according to claim 1, further comprising steps of:

forming a first spacer adjacent to the first gate structure portion and the first single charge trapping sidewall; and forming a second spacer adjacent to the second gate structure portion and the second single charge trapping sidewall.

7. The method for fabricating a nonvolatile memory device according to claim 1, wherein the process for forming the source/drain region comprises steps of performing at least one ion implantation to form a common source/drain region between the first gate structure portion and the second gate structure portion.

* * * * *